United States Patent
Okaniwa et al.

(10) Patent No.: US 9,028,949 B2
(45) Date of Patent: May 12, 2015

(54) SUBSTRATE FOR PRINTED WIRING AND RESIN COMPOSITION USED THEREFOR

(75) Inventors: Motoki Okaniwa, Tokyo (JP); Toshimitsu Kikuchi, Tokyo (JP); Takaaki Uno, Tokyo (JP); Takashi Okada, Tokyo (JP)

(73) Assignee: JSR Corporation, Tokyo (JP)

( * ) Notice: Subject to any disclaimer, the term of this patent is extended or adjusted under 35 U.S.C. 154(b) by 449 days.

(21) Appl. No.: 13/503,023

(22) PCT Filed: Oct. 20, 2010

(86) PCT No.: PCT/JP2010/068433
§ 371 (c)(1),
(2), (4) Date: Apr. 19, 2012

(87) PCT Pub. No.: WO2011/049104
PCT Pub. Date: Apr. 28, 2011

(65) Prior Publication Data
US 2012/0199383 A1    Aug. 9, 2012

(30) Foreign Application Priority Data

Oct. 20, 2009 (JP) ................................. 2009-241902
Jun. 30, 2010 (JP) ................................. 2010-149830

(51) Int. Cl.
*C08G 65/40* (2006.01)
*H05K 1/03* (2006.01)
*C08G 75/23* (2006.01)

(52) U.S. Cl.
CPC .............. *H05K 1/0326* (2013.01); *C08G 65/40* (2013.01); *C08G 65/4006* (2013.01); *C08G 75/23* (2013.01); *C08G 2650/40* (2013.01); *Y10S 428/901* (2013.01)

(58) Field of Classification Search
None
See application file for complete search history.

(56) References Cited

FOREIGN PATENT DOCUMENTS

| JP | 02045526 A * | 2/1990 |
| JP | 2002-84074 | 3/2002 |
| JP | 2002-322298 | 11/2002 |
| JP | 2008-69212 | 3/2008 |
| JP | 2008-255308 | 10/2008 |
| JP | 2008-273999 | 11/2008 |
| JP | 2009-522772 | 6/2009 |
| WO | WO 2007/078713 A2 | 7/2007 |

OTHER PUBLICATIONS

English translation of JP 02-045526A, Feb. 1990.*
International Search Report for International Application No. PCT/JP2010/068433, Dec. 7, 2010.

* cited by examiner

*Primary Examiner* — Ramsey Zacharia
(74) *Attorney, Agent, or Firm* — Oblon, McClelland, Maier & Neustadt, L.L.P.

(57) ABSTRACT

There are provided a substrate for printed wiring excellent in light transmission property, heat resistance, mechanical strength and resistance to thermal coloration; a printed wiring laminate; and a resin composition used to produce the substrate and the laminate. The substrate for printed wiring comprises an aromatic polyether-typed polymer having a glass transition temperature, as measured by differential scanning calorimetry (DSC, heating rate: 20° C./minute), of from 230° C. to 350° C.

13 Claims, No Drawings

SUBSTRATE FOR PRINTED WIRING AND RESIN COMPOSITION USED THEREFOR

TECHNICAL FIELD

The present invention relates to a substrate for printed wiring, and a resin composition used therefor.

BACKGROUND ART

In recent years, sophisticated various electronic devices such as mobile phones, digital cameras, navigators and others have had smaller size and lighter weight, and wiring patterns formed on substrates have had finer pitch. In association therewith, as an electronic wiring material for these uses, substrates for flexible printed wiring (FPC substrate) are demanded to have higher performances, specifically, light transmission property as high as that provided by glass and adhesion with a wiring portion, as well as heat resistance and flexibility.

As a polymer for forming the flexible printed wiring board, for example, an all-aromatic polyimide, as shown in Patent Document 1, has been used (e.g., APICAL manufactured by Kaneka Corporation).

However, the substrate comprising the polyimide has yellow-brown coloration as a result of the formation of a charge transfer complex within a molecule and between molecules, and thus is difficult to use for an application requiring light transmission property as high as that provided by glass.

Furthermore, the formation of a film from the polyimide requires imidization at a temperature of from 300 to 500° C.

CITATION LIST

Patent Document

Patent Document 1: JP-A-2002-322298

SUMMARY OF THE INVENTION

Problem to be Solved by the Invention

The present invention has been made in view of the above problem. It is an object of the present invention to provide a substrate for printed wiring excellent in light transmission property, heat resistance, mechanical strength and resistance to thermal coloration; a printed wiring laminate using the substrate; and a resin composition used to produce the substrate.

Means for Solving the Problem

The present inventors have earnestly studied the problem, and have found that a substrate for printed wiring comprising a polymer that comprises a specific structural unit can solve the problem identified by the present invention, thereby completing the present invention.

That is, the present invention provides the following [1] to [12].

[1] A substrate for printed wiring comprising an aromatic polyether-typed polymer having a glass transition temperature, as measured by differential scanning calorimetry (DSC, heating rate: 20° C./minute), of from 230° C. to 350° C.

[2] The substrate for printed wiring as described in [1], wherein the aromatic polyether-typed polymer is a polymer comprising at least one structural unit (i) selected from the group consisting of a structural unit represented by the following formula (1) and a structural unit represented by the following formula (2).

[Chem. 1]

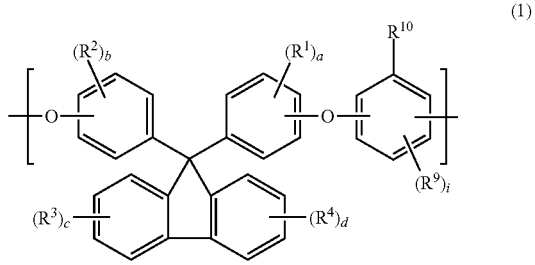

(1)

(In the formula (1), $R^1$ to $R^4$ are each independently a monovalent organic group having 1 to 12 carbon atoms; $R^9$ are each independently a monovalent organic group having 1 to 12 carbon atoms; $R^{10}$ is cyano group or nitro group; a to d are each an integer of from 0 to 4; and i is an integer of from 0 to 3.)

[Chem. 2]

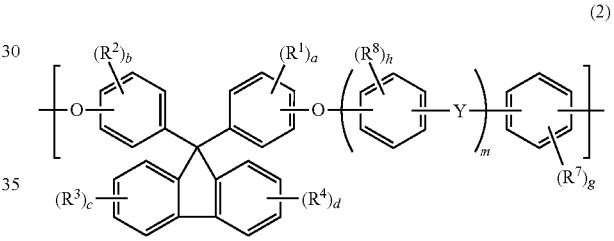

(2)

(In the formula (2), $R^1$ to $R^4$ and a to d are each independently defined in the same manner as $R^1$ to $R^4$ and a to d in the formula (1); Y is a single bond, $-SO_2-$, or $>C=O$; $R^7$ and $R^8$ are each independently a halogen atom, a monovalent organic group having 1 to 12 carbon atoms, or nitro group; g and h are each independently an integer of from 0 to 4; and m is 0 or 1.)

[3] The substrate for printed wiring as described in [1] or [2], wherein the polymer further comprises at least one structural unit (ii) selected from the group consisting of a structural unit represented by the following formula (3) and a structural unit represented by the following formula (4).

[Chem. 3]

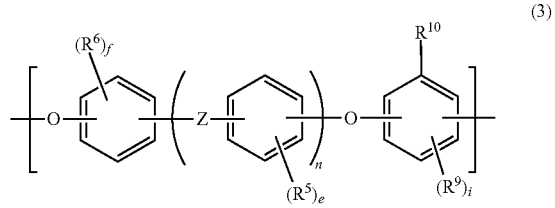

(3)

(In the formula (3), $R^9$, $R^{10}$ and i are each independently defined in the same manner as $R^9$, $R^{10}$ and i in the formula (1); $R^5$ and $R^6$ are each independently a monovalent organic group having 1 to 12 carbon atoms; Z is a single bond, $-O-$, —S—, —SO$_2$—, >C=O, —CONH—, —COO—, or a divalent organic group having 1 to 12 carbon atoms, e and f are each an integer of from 0 to 4; and n is 0 or 1.)

[Chem. 4]

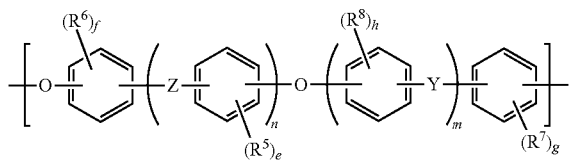

(4)

(In the formula (4), R$^7$, R$^8$, Y, m, g and h are each independently defined in the same manner as R$^7$, R$^8$, Y, m, g and h in the formula (2); R$^5$, R$^6$, Z, n, e and f are each independently defined in the same manner as R$^5$, R$^6$, Z, n, e and f in the formula (3).)

[4] The substrate for printed wiring as described in [3], wherein in the polymer, the molar ratio between the structural unit (i) and the structural unit (ii) is in the range of from 30:70 to 90:10.

[5] The substrate for printed wiring as described in [3] or [4], wherein the polymer comprises the structural unit (i) and the structural unit (ii), in an amount of 70 mol % or more, in all structural units of the polymer.

[6] The substrate for printed wiring as described in any one of [1] to [5], wherein the substrate, when having a thickness of 50 μm, has a total light transmittance in accordance with JIS K7105 transparency test method of 85% or more.

[7] The substrate for printed wiring as described in any one of [1] to [6], which has a tensile strength in accordance with JIS K7127 of from 80 to 150 MPa.

[8] The substrate for printed wiring as described in any one of [1] to [7], which has an elongation at break in accordance with JIS K7127 of from 10 to 100%.

[9] The substrate for printed wiring as described in any one of [1] to [8], which has a tensile modulus in accordance with JIS K7127 of from 2.5 to 4.0 GPa.

[10] A printed wiring laminate comprising a wiring portion provided on the substrate for printed wiring as described in any one of [1] to [9].

[11] A resin composition for forming a substrate for printed wiring, which composition comprises a polymer comprising at least one structural unit selected from the group consisting of a structural unit represented by the following formula (1) and a structural unit represented by the following formula (2), and an organic solvent.

[Chem. 5]

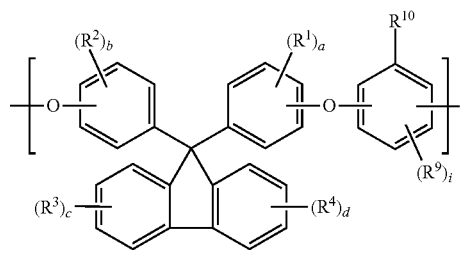

(1)

(In the formula (1), R$^1$ to R$^4$ are each independently a monovalent organic group having 1 to 12 carbon atoms; R$^9$ are each independently a monovalent organic group having 1 to 12 carbon atoms; R$^{10}$ is cyano group or nitro group; a to d are each an integer of from 0 to 4; i is an integer of from 0 to 3.)

[Chem. 6]

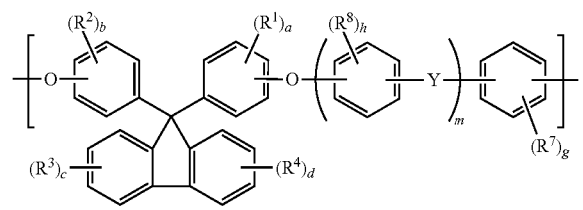

(2)

(In the formula (2), R$^1$ to R$^4$ and a to d are each independently defined in the same manner as R$^1$ to R$^4$ and a to d in the formula (1); Y is a single bond, —SO$_2$—, or >C=O; R$^7$ and R$^8$ are each independently a halogen atom, a monovalent organic group having 1 to 12 carbon atoms, or nitro group; g and h are each an integer of from 0 to 4; and m is 0 or 1.)

[12] The resin composition for forming a substrate for printed wiring as described in [11], wherein the polymer further comprises at least one structural unit selected from the group consisting of a structural unit represented by the following formula (3) and a structural unit represented by the following formula (4).

[Chem. 7]

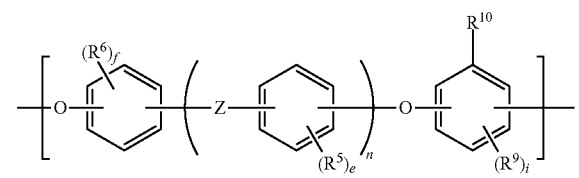

(3)

(In the formula (3), R$^9$, R$^{10}$ and i are each independently defined in the same manner as R$^9$, R$^{10}$ and i in the formula (1); R$^5$ and R$^6$ are each independently a monovalent organic group having 1 to 12 carbon atoms; Z is a single bond, —O—, —S—, —SO$_2$—, >C=O, —CONH—, —COO—, or a divalent organic group having 1 to 12 carbon atoms; e and f are each an integer of from 0 to 4; and n is 0 or 1.)

[Chem. 8]

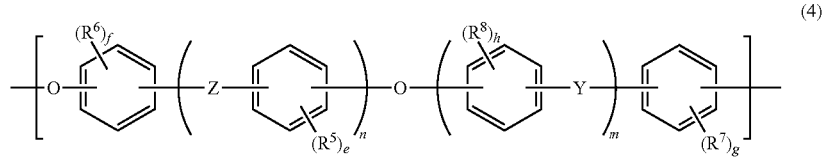

(4)

(In the formula (4), $R^7$, $R^8$, Y, m, g and h are each independently defined in the same manner as $R^7$, $R^8$, Y, m, g and h in the formula (2); $R^5$, $R^6$, Z, n, e and f are each independently defined in the same manner as $R^5$, $R^6$, Z, n, e and f in the formula (3).)

Effect of the Invention

The substrate for printed wiring of the present invention comprises a heat resistant polymer having excellent transparency and moldability, and therefore, has high light transmission property and excellent heat resistance and resistance to thermal coloration. Therefore, the substrate for printed wiring of the present invention can be favorably used for substrates for conductive flexible printed wiring and rigid printed wiring of mobile phones, touch panels, electronic paper and the like, substrates for photoelectronic printed wiring, substrates for COF (Chip on Film), substrates for TAB (Tape Automated Bonding), and the like.

EMBODIMENTS FOR CARRYING OUT THE INVENTION

The substrate for printed wiring of the present invention comprises an aromatic polyether-typed polymer having a glass transition temperature (glass transition point), as measured by differential scanning calorimetry (DSC, heating rate: 20° C./minute), of from 230° C. to 350° C. The glass transition temperature of the polymer is, specifically, measured using a DSC 8230 measurement apparatus manufactured by Rigaku Corporation (heating rate: 20° C./minute), and is preferably from 240 to 330° C., more preferably from 250 to 300° C.

The aromatic polyether-typed polymer is a polymer obtained from a reaction to form an ether bond at the main chain.

The substrate comprising such an aromatic polyether-typed polymer has excellent heat resistance and resistance to thermal coloration, and thus is used favorably for printed wiring, particularly as a substrate for printed wiring applicable in a process involving a temperature of 220° C. or higher, such as solder reflow process. Furthermore, the aromatic polyether-typed polymer has excellent molding processability, and thus the substrate comprising the polymer is used favorably as a substrate for printed wiring. In the present invention, the "resistance to thermal coloration" refers to a difficulty of coloration in the case where heat treatment is carried out at high temperature (220 to 300° C.) for about 1 to 3 hours in atmosphere.

The aromatic polyether-typed polymer is preferably a polymer (hereinafter also referred to as a "polymer (I)") comprising at least one structural unit (i) selected from the group consisting of a structural unit represented by the following formula (1) and a structural unit represented by the following formula (2). A polymer, by comprising the structural unit (i), forms an aromatic polyether having a glass transition temperature of from 230 to 350° C. The polymer (I) has excellent transparency and resistance to thermal coloration, and thus the substrate comprising the polymer has high light transmission property and excellent resistance to thermal coloration. Furthermore, the substrate comprising the polymer (I) has excellent adhesion with a conductive layer such as a wiring portion provided on a surface of the substrate, and is hardly deformed or hardly has lowered mechanical strength even under high temperature and has excellent dimensional stability even under high humidity. Thus, such a substrate is favorably used for printed wiring.

[Chem. 9]

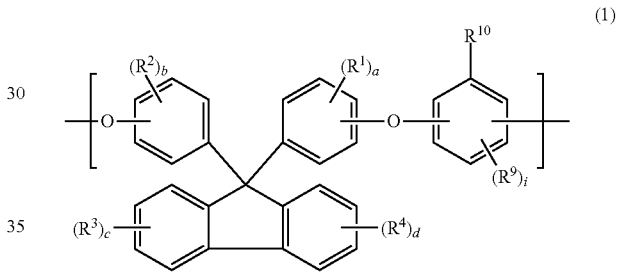

(1)

In the formula (1), $R^1$ to $R^4$ are each independently a monovalent organic group having 1 to 12 carbon atoms; $R^9$ are each independently a monovalent organic group having 1 to 12 carbon atoms; $R^{10}$ is cyano group or nitro group; a to d are each an integer of from 0 to 4; and i is an integer of from 0 to 3.

Examples of the monovalent organic group having 1 to 12 carbon atoms include a monovalent hydrocarbon group having 1 to 12 carbon atoms, and a monovalent hydrocarbon group having 1 to 12 carbon atoms and containing at least one kind of atom selected from the group consisting of an oxygen atom and a nitrogen atom.

Examples of the monovalent hydrocarbon group having 1 to 12 carbon atoms include a linear or branched hydrocarbon group having 1 to 12 carbon atoms, an alicyclic hydrocarbon group having 3 to 12 carbon atoms, and an aromatic hydrocarbon group having 6 to 12 carbon atoms.

As the linear or branched hydrocarbon group having 1 to 12 carbon atoms, preferred is a linear or branched hydrocarbon group having 1 to 8 carbon atoms, and more preferred is a linear or branched hydrocarbon group having 1 to 5 carbon atoms.

As the linear or branched hydrocarbon group, preferred are specifically methyl group, ethyl group, n-propyl group, isopropyl group, n-butyl group, sec-butyl group, tert-butyl group, n-pentyl group, n-hexyl group, n-heptyl group and the like.

As the alicyclic hydrocarbon group having 3 to 12 carbon atoms, preferred is an alicyclic hydrocarbon group having 3 to 8 carbon atoms, and more preferred is an alicyclic hydrocarbon group having 3 or 4 carbon atoms.

As the alicyclic hydrocarbon group having 3 to 12 carbon atoms, preferred are a cycloalkyl group such as cyclopropyl group, cyclobutyl group, cyclopentyl group and cyclohexyl group; and a cycloalkenyl group such as cyclobutenyl group, cyclopentenyl group, and cyclohexenyl group. A bonding position of the alicyclic hydrocarbon group may be any carbon on the alicyclic ring.

Examples of the aromatic hydrocarbon group having 6 to 12 carbon atoms include phenyl group, biphenyl group and naphthyl group. A bonding position of the aromatic hydrocarbon group may be any carbon on the aromatic ring.

Examples of the hydrocarbon group having 1 to 12 carbon atoms and containing an oxygen atom include a hydrocarbon group having 1 to 12 carbon atoms and containing an ether bond, a carbonyl group, or an ester group.

Examples of the hydrocarbon group having 1 to 12 carbon atoms and containing an ether bond include an alkoxy group having 1 to 12 carbon atoms, an alkenyloxy group having 2 to 12 carbon atoms, an alkynyloxy group having 2 to 12 carbon atoms, an aryloxy group having 6 to 12 carbon atoms and an alkoxyalkyl group having 1 to 12 carbon atoms. Specific examples are methoxy group, ethoxy group, propoxy group, isopropyloxy group, butoxy group, phenoxy group, propenyloxy group, cyclohexyloxy group and methoxymethyl group.

Examples of the hydrocarbon group having 1 to 12 carbon atoms and containing a carbonyl group include an acyl group having 2 to 12 carbon atoms, with specific examples including acetyl group, propionyl group, isopropionyl group and benzoyl group.

Examples of the hydrocarbon group having 1 to 12 carbon atoms and containing an ester group include an acyloxy group having 2 to 12 carbon atoms, with specific examples including acetyloxy group, propionyloxy group, isopropionyloxy group and benzoyloxy group.

Examples of the hydrocarbon group having 1 to 12 carbon atoms and containing a nitrogen atom include imidazole group, triazole group, benzimidazole group and benztriazole group.

Specific examples of the hydrocarbon group having 1 to 12 carbon atoms and containing an oxygen atom and a nitrogen atom include oxazole group, oxadiazole group, benzoxazole group and benzoxadiazole group.

[Chem. 10]

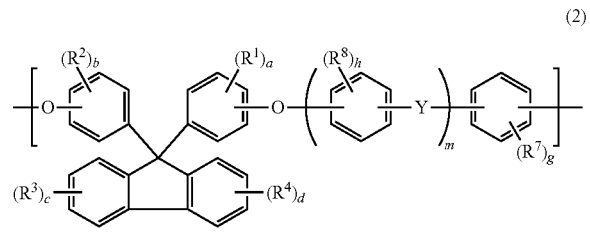

(2)

In the formula (2), $R^1$ to $R^4$ and a to d are each independently defined in the same manner as $R^1$ to $R^4$ and a to d in the formula (1); Y is a single bond, $-SO_2-$, or $>C=O$; $R^7$ and $R^8$ are each independently a halogen atom, a monovalent organic group having 1 to 12 carbon atoms, or nitro group; g and h are each an integer of from 0 to 4; and m is 0 or 1. When m is 0, preferably, $R^7$ is neither cyano group nor nitro group.

As the monovalent organic group having 1 to 12 carbon atoms, functional groups as described above and the like can be mentioned.

The polymer (I) may further comprise at least one structural unit (ii) selected from the group consisting of a structural unit represented by the following formula (3) and a structural unit represented by the following formula (4). The polymer (I) comprising the structural unit (ii) is preferred, because the substrate for printed wiring comprising the polymer (I) has improved mechanical properties.

[Chem. 11]

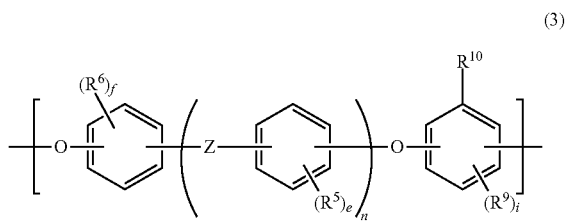

(3)

In the formula (3), $R^9$, $R^{10}$ and i are each independently defined in the same manner as $R^9$, $R^{10}$ and i in the formula (1); $R^5$ and $R^6$ are each independently a monovalent organic group having 1 to 12 carbon atoms; Z is a single bond, $-O-$, $-S-$, $-SO_2-$, $>C=O$, $-CONH-$, $-COO-$, or a divalent organic group having 1 to 12 carbon atoms; e and f are each an integer from 0 to 4; and n is 0 or 1.

As the monovalent organic group having 1 to 12 carbon atoms, functional groups as described above and the like can be mentioned.

Examples of the divalent organic group having 1 to 12 carbon atoms include a divalent hydrocarbon group having 1 to 12 carbon atoms, a divalent halogenated hydrocarbon group having 1 to 12 carbon atoms, a divalent hydrocarbon group having 3 to 12 carbon atoms and containing at least one kind of atom selected from the group consisting of an oxygen atom and a nitrogen atom, and a divalent halogenated hydrocarbon group having 3 to 12 carbon atoms and containing at least one kind of atom selected from the group consisting of an oxygen atom and a nitrogen atom.

Examples of the divalent hydrocarbon group having 1 to 12 carbon atoms include a linear or branched divalent hydrocarbon group having 1 to 12 carbon atoms, a divalent alicyclic hydrocarbon group having 3 to 12 carbon atoms, and a divalent aromatic hydrocarbon group having 6 to 12 carbon atoms.

Examples of the linear or branched divalent hydrocarbon group having 1 to 12 carbon atoms include methylene group, ethylene group, trimethylene group, isopropylidene group, pentamethylene group, hexamethylene group, and heptamethylene group.

Examples of the divalent alicyclic hydrocarbon group having 3 to 12 carbon atoms include a cycloalkylene group such as cyclopropylene group, cyclobutylene group, cyclopentylene group, and cyclohexylene group; and a cycloalkenylene group such as cyclobutenylene group, cyclopentenylene group and cyclohexenylene group.

Examples of the divalent aromatic hydrocarbon group having 6 to 12 carbon atoms include phenylene group, naphthylene group and biphenylene group.

Examples of the divalent halogenated hydrocarbon group having 1 to 12 carbon atoms include a linear or branched divalent halogenated hydrocarbon group having 1 to 12 carbon atoms, a divalent halogenated alicyclic hydrocarbon group having 3 to 12 carbon atoms, and a divalent halogenated aromatic hydrocarbon group having 6 to 12 carbon atoms.

Examples of the linear or branched divalent halogenated hydrocarbon group having 1 to 12 carbon atoms include difluoromethylene group, dichloromethylene group, tetrafluoroethylene group, tetrachloroethylene group, hexafluorotrimethylene group, hexachlorotrimethylene group, hexafluoroisopropylidene group, and hexachloroisopropylidene group.

Examples of the divalent halogenated alicyclic hydrocarbon group having 3 to 12 carbon atoms include a group obtained by substituting at least one hydrogen atom of a group exemplified in the divalent alicyclic hydrocarbon group having 3 to 12 carbon atoms with a fluorine atom, a chlorine atom, a bromine atom or an iodine atom.

Examples of the divalent halogenated aromatic hydrocarbon group having 6 to 12 carbon atoms include a group obtained by substituting at least one hydrogen atom of a group exemplified in the divalent aromatic hydrocarbon group having 6 to 12 carbon atoms with a fluorine atom, a chlorine atom, a bromine atom or an iodine atom.

Examples of the divalent hydrocarbon group having 1 to 12 carbon atoms and containing at least one kind of atom selected from the group consisting of an oxygen atom and a nitrogen atom include a divalent hydrocarbon group having 1 to 12 carbon atoms and containing an ether bond, a carbonyl group, an ester group, or an amide group.

Examples of the divalent halogenated hydrocarbon group having 1 to 12 carbon atoms and containing at least one kind of atom selected from the group consisting of an oxygen atom and a nitrogen atom include a group obtained by substituting at least one hydrogen atom of a group exemplified in the divalent hydrocarbon group having 1 to 12 carbon atoms and containing an oxygen atom and/or a nitrogen atom with a fluorine atom, a chlorine atom, a bromine atom or an iodine atom.

more in all structural units of the polymer (I), more preferably in an amount of 95 mol % or more in all structural units of the polymer (I).

The polymer (I) can be obtained, for example, by reacting a component (hereinafter also referred to as a "component (A)") containing at least one compound selected from the group consisting of a compound represented by the following formula (A) (hereinafter also referred to as a "compound (A)") and a compound represented by the following formula (8) (hereinafter also referred to as a "compound (8)") with a component (hereinafter also referred to as a "component (B)") containing a compound represented by the following formula (B).

[Chem. 13]

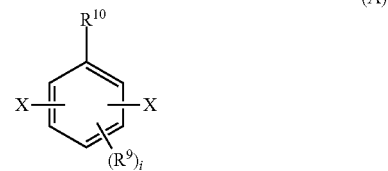

In the formula (A), $R^9$, $R^{10}$ and i are each independently defined in the same manner as $R^9$, $R^{10}$ and i in the formula (1); and X are independently a halogen atom.

[Chem. 14]

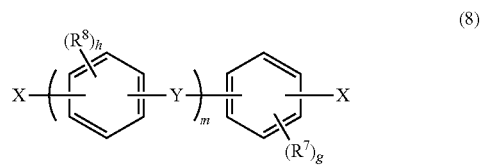

[Chem. 12]

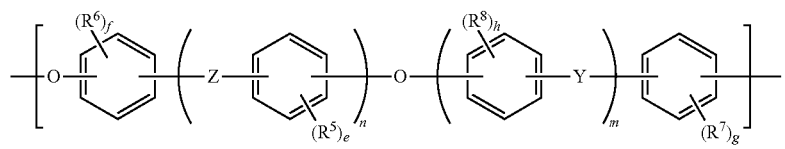

In the formula (4), $R^7$, $R^8$, Y, m, g and h are each independently defined in the same manner as $R^7$, $R^8$, Y, m, g and h in the formula (2); and $R^5$, $R^6$, Z, n, e and f are each independently defined in the same manner as $R^5$, $R^6$, Z, n, e and f in the formula (3). When m is 0, preferably, $R^7$ is neither cyano group nor nitro group.

In the polymer (I), in terms of heat resistance and mechanical properties, the molar ratio between the structural unit (i) and the structural unit (ii) is preferably (i):(ii)=30:70 to 90:10, more preferably (i):(ii)=40:60 to 90:10, still more preferably (i):(ii)=50:50 to 90:10, provided that the total molar ratio of both the components is 100.

In the present invention, mechanical properties refer to nature of the polymer, such as tensile strength, elongation at break and tensile modulus.

The polymer (I) comprises the structural unit (i) and/or the structural unit (ii), preferably in an amount of 70 mol % or In the formula (8), $R^7$, $R^8$, Y, m, g and h are each independently defined in the same manner as $R^7$, $R^8$, Y, m, g and h in the formula (2); and X is defined in the same manner as X in the formula (A).

[Chem. 15]

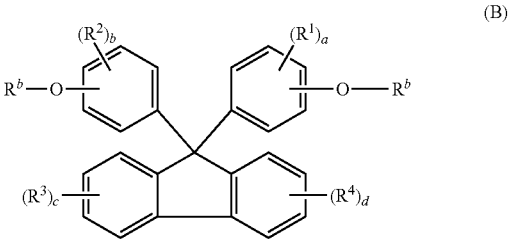

In the formula (B), $R^b$ are each independently a hydrogen atom, methyl group, ethyl group, acetyl group, methanesulfonyl group, or trifluoromethylsulfonyl group. Among these, a hydrogen atom is preferred.

$R^1$ to $R^4$ and a to d in the formula (B) are each independently defined in the same manner as $R^1$ to $R^4$ and a to d in the formula (1).

Specific examples of the compound (A) include 2,6-difluorobenzonitrile, 2,5-difluorobenzonitrile, 2,4-difluorobenzonitrile, 2,6-dichlorobenzonitrile, 2,5-dichlorobenzonitrile, 2,4-dichlorobenzonitrile, 2,6-difluoronitrobenzene, 2,5-difluoronitrobenzene, 2,4-difluoronitrobenzene, 2,6-dichloronitrobenzene, 2,5-dichloronitrobenzene, 2,4-dichloronitrobenzene and reactive derivatives thereof. In particular, in terms of reactivity, economical viewpoint, etc., preferred are 2,6-difluorobenzonitrile, and 2,6-dichlorobenzonitrile. These compounds can be used in combination of two or more kinds.

Specific examples of the compound (8) include 4,4'-difluorobenzophenone, 4,4'-difluorodiphenylsulfone, 2,4'-difluorobenzophenone, 2,4'-difluorodiphenylsulfone, 2,2'-difluorobenzophenone, 2,2'-difluorodiphenylsulfone, 3,3'-dinitro-4,4'-difluorobenzophenone, 3,3'-dinitro-4,4'-difluorodiphenylsulfone, 4,4'-dichlorobenzophenone, 4,4'-dichlorodiphenylsulfone, 2,4'-dichlorobenzophenone, 2,4'-dichlorodiphenylsulfone, 2,2'-dichlorobenzophenone, 2,2'-dichlorodiphenylsulfone, 3,3'-dinitro-4,4'-dichlorobenzophenone, and 3,3'-dinitro-4,4'-dichlorodiphenylsulfone. These compounds can be used in combination of two or more kinds.

At least one compound selected from the group consisting of the compound (A) and the compound (8) is contained preferably in an amount of 80 mol % to 100 mol %, more preferably 90 mol % to 100 mol %, in 100 mol % of the component (A).

The component (B) preferably contains a compound represented by the following formula (9) (hereinafter also referred to as a "compound (9)"), and as needed, preferably contains a compound represented by the following formula (10). The compound (9) is contained preferably in an amount of 80 mol % to 100 mol %, more preferably 90 mol % to 100 mol %, in 100 mol % of the component (B).

[Chem. 16]

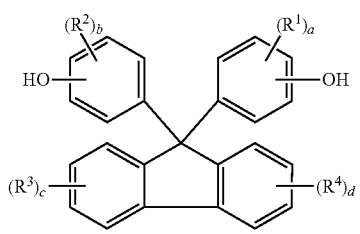

(9)

In the formula (9), $R^1$ to $R^4$ and a to d are each independently defined in the same manner as $R^1$ to $R^4$ and a to d in the formula (1).

Specific examples of the compound (9) include 9,9-bis(4-hydroxyphenyl)fluorene, 9,9-bis(3-phenyl-4-hydroxyphenyl)fluorene, 9,9-bis(3,5-diphenyl-4-hydroxyphenyl)fluorene, 9,9-bis(4-hydroxy-3-methylphenyl)fluorene, 9,9-bis(4-hydroxy-3,5-dimethylphenyl)fluorene, 9,9-bis(4-hydroxy-3-cyclohexylphenyl)fluorene, and reactive derivatives thereof. Among the above compounds, preferred are 9,9-bis(4-hydroxyphenyl)fluorene and 9,9-bis(3-phenyl-4-hydroxyphenyl)fluorene. These compounds can be used in combination of two or more kinds.

[Chem. 17]

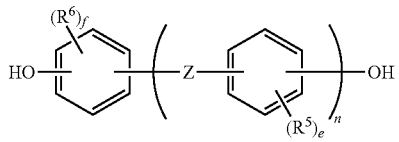

(10)

In the formula (10), $R^5$, $R^6$, Z, n, e and f are each independently defined in the same manner as $R^5$, $R^6$, Z, n, e and f in the formula (3).

Examples of the compound represented by the formula (10) include hydroquinone, resorcinol, 2-phenylhydroquinone, 4,4'-biphenol, 3,3'-biphenol, 4,4'-dihydroxydiphenylsulfone, 3,3'-dihydroxydiphenylsulfone, 4,4'-dihydroxybenzophenone, 3,3'-dihydroxybenzophenone, 1,1'-bi-2-naphthol, 1,1'-bi-4-naphthol, 2,2-bis(4-hydroxyphenyl)propane, 1,1-bis(4-hydroxyphenyl)cyclohexane, 2,2-bis(4-hydroxyphenyl)-1,1,1,3,3,3-hexafluoropropane, and reactive derivatives thereof. These compounds can be used in combination of two or more kinds.

Among the above compounds, 4,4'-biphenol is preferred in terms of reactivity and mechanical properties.

The polymer (I) can be synthesized, more specifically, by a method described below.

The compound (9) contained in the component (B) is reacted with an alkali metal compound in an organic solvent to obtain an alkali metal salt of the compound (9). The resultant alkali metal salt is reacted with the compound (A) and/or the compound (8) contained in the component (A). By carrying out the reaction between the compound (9) and the alkali metal compound in the presence of the compound (A) and/or the compound (8), the alkali metal salt of the compound (9) can be reacted with the compound (A) and/or the compound (8).

Examples of the alkali metal compound used in the reaction include an alkali metal such as lithium, potassium and sodium; an alkali metal hydride such as lithium hydride, potassium hydride and sodium hydride; an alkali metal hydroxide such as lithium hydroxide, potassium hydroxide and sodium hydroxide; and an alkali metal carbonate such as lithium hydrogen carbonate, and potassium hydrogen carbonate and sodium hydrogen carbonate. These can be used in a single kind or in combination of two or more kinds.

The alkali metal compound is used in such an amount that with respect to a —O—$R^b$ in the formula (B), the amount of a metal atom in the alkali metal compound is usually 1 to 3 times by equivalents, preferably 1.1 to 2 times by equivalents, more preferably 1.2 to 1.5 times by equivalents.

Examples of the organic solvent used in the reaction include
N,N-dimethylacetoamide, N,N-dimethylformamide, N-methyl-2-pyrrolidone, 1,3-dimethyl-2-imidazolidinone, γ-butyllactone, sulfolane, dimethylsulfoxide, diethylsulfoxide, dimethylsulfone, diethylsulfone, diisopropylsulfone, diphenylsulfone, diphenylether, benzophenone, dialkoxybenzene (the number of carbons of the alkoxy group: 1 to 4) and trialkoxybenzene (the number of carbons of the alkoxy group: 1 to 4). Among these solvents, particularly preferred are N-methyl-2-pyrrolidone, N,N-dimethylacetoamide, sulfolane, diphenylsulfone, dimethylsulfoxide and the like, which are polar organic solvents having high dielectric constant.

In the reaction, a solvent azeotropic with water, such as benzene, toluene, xylene, hexane, cyclohexane, octane, chlorobenzene, dioxane, tetrahydrofuran, anisole and phenetole is further employable.

The usage ratios of the component (A) and the component (B) provided that the total amount of the component (A) and the component (B) is 100 mol % are as follows: the component (A) is used preferably in an amount of 45 mol % to 55 mol %, more preferably 50 mol % to 52 mol %, still more preferably more than 50 mol % to 52 mol %; and the component (B) is used preferably in an amount of 45 mol % to 55 mol %, more preferably 48 mol % to 50 mol %, still more preferably 48 mol % to less than 50 mol %.

The reaction temperature is preferably in the range of from 60° C. to 250° C., more preferably from 80° C. to 200° C. The reaction time is preferably in the range of from 15 minutes to 100 hours, more preferably from 1 hour to 24 hours.

The aromatic polyether-typed polymer does not require high temperature treatment for imidization which is necessary for the synthesis of the polyimide-typed polymer. For this reason, a load on the polymer production process is low, and the polymer can be easily produced.

The aromatic polyether-typed polymer preferably has a weight average molecular weight (Mw) in terms of polystyrene, as measured using a HLC-8220 GPC apparatus manufactured by TOSOH (solvent: N-methyl-2-pyrrolidone having lithium bromide and phosphoric acid added therein), of 5,000 to 500,000, more preferably 15,000 to 250,000.

The resin composition of the present invention comprises the polymer (I) and an organic solvent.

A mixture of the polymer (I) obtained by the above process and the organic solvent can be used, as it is, as the resin composition of the present invention for the production of the substrate for printed wiring. By using such a resin composition, the substrate for printed wiring can be produced easily and inexpensively.

Alternatively, the resin composition can be prepared by a method in which the polymer is isolated (purified) as a solid component from the mixture of the polymer (I) obtained by the above process and the organic solvent, and the solid component is redissolved in an organic solvent. By using such a resin composition, the substrate for printed wiring can be produced which has much less coloration and excellent light transmission property.

The isolation (purification) of the polymer (I) as the solid component can be carried out, for example, by reprecipitating the polymer in a poor polymer solvent such as methanol, filtering the solution, and then drying a cake under reduced pressure. Preferred examples of the organic solvent for dissolving the polymer (I) include methylene chloride, tetrahydrofuran, cyclohexanone, N,N-dimethylformamide, N,N-dimethylacetoamide, N-methylpyrrolidone and γ-butyrolactone. In terms of coatability and economical viewpoint, more preferred are methylene chloride, N,N-dimethylacetoamide and N-methylpyrrolidone. These solvents can be used in a single kind or in combination of two or more kinds.

The polymer concentration of the resin composition of the present invention in which the polymer (I) has been dissolved is usually 5 to 40 wt %, preferably 7 to 25 wt %, though depending on a molecular weight of the polymer. If the concentration is less than 5 wt %, the formation of a thick film may be difficult, and a pinhole may be generated. On the other hand, if the concentration is more than 40 wt %, the viscosity of the resin composition is too high, which may make the film formation difficult and may make the surface lack the smoothness.

The viscosity of the resin composition of the present invention is usually 2,000 to 100,000 mPa·s, preferably 3,000 to 50,000 mPa·s, though depending on a molecular weight or a concentration of the polymer. If the viscosity is less than 2,000 mPa·s, the retentivity of the resin composition during the film formation may be poor, and the resin composition may spill out from a support. On the other hand, if the viscosity is more than 100,000 mPa·s, the viscosity is too high, which may make it difficult to control the film thickness, and may make it difficult to form the substrate for printed wiring.

The resin composition of the present invention can further comprise an anti-aging agent. By comprising the anti-aging agent, the resultant substrate for printed wiring can have much improved durability.

A preferable example of the anti-aging agent is a hindered phenol-typed compound having a molecular weight of 500 or more.

Examples of the hindered phenol-typed compound having a molecular weight of 500 or more employable in the present invention include triethyleneglycol-bis[3-(3-tert-butyl-5-methyl-4-hydroxyphenyl)propionate], 1,6-hexanediol-bis[3-(3,5-di-tert-butyl-4-hydroxyphenyl)propionate], 2,4-bis-(n-octylthio)-6-(4-hydroxy-3,5-di-tert-butylanilino)-3,5-triazine, pentaerythritoltetrakis[3-(3,5-tert-butyl 4-hydroxyphenyl) propionate], 1,1,3-tris[2-methyl-4-[3-(3,5-di-tert-butyl-4-hydroxyphenyl)propionyloxy]-5-tert-butylphenyl]butane, 2,2-thio-diethylenebis[3-(3,5-di-tert-butyl-4-hydroxyphenyl)propionate], octadecyl-3-(3,5-di-tert-butyl-4-hydroxyphenyl)propionate, N,N-hexamethylenebis(3,5-di-tert-butyl-4-hydroxy-hydrocinnamamide), 1,3,5-trimethyl-2,4,6-tris(3,5-di-tert-butyl-4-hydroxybenzyl) benzene, tris-(3,5-di-tert-butyl-4-hydroxybenzyl)-isocyanurate, and, 3,9-bis[2-[3-(3-tert-butyl-4-hydroxy-5-methylphenyl)propionyl oxy]-1,1-dimethylethyl]-2,4,8,10-tetraoxaspiro[5.5]undecane.

These anti-aging agents can be used in a single kind or in combination of two or more kinds.

In the present invention, the hindered phenol-typed compound having a molecular weight of 500 or more is used preferably in an amount of 0.01 to 10 parts by weight, based on 100 parts by weight of the polymer (I).

The substrate for printed wiring of the present invention comprises the aromatic polyether-typed polymer. The substrate for printed wiring of the present invention may comprise, in addition to the polymer of the present invention, additives according to desired uses, but it is preferable that the substrate for printed wiring of the present invention consists essentially of the polymer of the present invention.

The production method of the substrate for printed wiring of the present invention is not particularly limited, but the method preferably comprises a step of applying the resin composition on a support to form a coating film, and a step of evaporating the organic solvent from the coating film thereby removing the organic solvent to obtain a film.

Exemplary methods for applying the resin composition on a support to form a coating film include roll coating, gravure coating, spin coating and a method using a doctor blade.

The thickness of the coating film is not particularly limited, but is, for example, 1 to 250 μm, preferably 2 to 150 μm, more preferably 5 to 125 μm. Examples of the support include a polyethyleneterephthalate (PET) film and a SUS plate.

The step of evaporating the organic solvent from the coating film thereby removing the organic solvent can be carried out, specifically, by heating the coating film. By heating the coating film, the organic solvent in the coating film can be evaporated and thus removed. The heating conditions can be arbitrarily determined according to a support or a polymer, as long as the organic solvent is evaporated. For example, the heating temperature is preferably from 30° C. to 300° C., more preferably from 40° C. to 250° C., still more preferably from 50° C. to 230° C.

The heating time is preferably 10 minutes to 5 hours. The heating may be carried out in two or more stages. A specific method is for example such that drying is carried out at a temperature of from 30 to 80° C. for 10 minutes to 2 hours, and then heating is carried out at a temperature of from 100° C. to 250° C. for 10 minutes to 2 hours. As needed, drying may be carried out under nitrogen atmosphere or under reduced pressure.

The residual solvent amount in the substrate obtained after this step of removing the organic solvent (thermogravimetric analysis method: TGA, under nitrogen atmosphere, heating rate: 10° C./minute) is preferably 0 to 1.2 wt %, more preferably 0 to 1 wt %, based on 100 wt % of the substrate. When the residual solvent amount is within this range, a substrate can be obtained which has excellent heat resistance, and is hardly deformed or hardly has lowered mechanical strength particularly even under high temperature. Thus, the substrate is employed suitably for printed wiring.

The resultant film can be delaminated from the support and used as the substrate for printed wiring, or can be used without being removed from the support as the substrate for printed wiring.

The substrate for printed wiring of the present invention has a glass transition temperature (Tg), as measured using a DSC 8230 measurement apparatus manufactured by Rigaku Corporation (heating rate: 20° C./minute), of from 230 to 350° C., more preferably from 240 to 330° C., still more preferably from 250 to 300° C. When the glass transition temperature is within the above range, the substrate for printed wiring of the present invention can be used more suitably for printed wiring.

The substrate for printed wiring of the present invention preferably has a thickness of 1 to 250 μm, more preferably 2 to 150 μm, still more preferably 10 to 125 μm.

The substrate for printed wiring of the present invention, when having a thickness of 50 μm, preferably has a total light transmittance in accordance with JIS K7105 transparency test method, of 85% or more, more preferably 88% or more. The total light transmittance is measurable using a SC-3H haze meter manufactured by Suga Test Instruments Co., Ltd.

The substrate for printed wiring of the present invention, when having a thickness of 50 μm, preferably has a light transmittance at a wavelength of 400 nm of 70% or more, more preferably 75% or more, still more preferably 80% or more. The light transmittance at a wavelength of 40 nm is measurable using a V-570 UV/VIS/NIR spectroscope manufactured by JASCO Corporation.

The substrate for printed wiring of the present invention preferably has a tensile strength of from 80 to 150 MPa, more preferably from 85 to 130 MPa, still more preferably from 85 to 120 MPa. The tensile strength is measurable using a tensile tester 5543 (manufactured by INSTRON).

The substrate for printed wiring of the present invention preferably has an elongation at break of from 5 to 100%, more preferably from 10 to 100%, still more preferably from 15 to 100%. The elongation at break is measurable using a tensile tester 5543 (manufactured by INSTRON).

The substrate for printed wiring of the present invention preferably has a tensile modulus of from 2.5 to 4.0 GPa, more preferably from 2.7 to 3.7 GPa. The tensile modulus is measurable using a tensile tester 5543 (manufactured by INSTRON).

The substrate for printed wiring of the present invention preferably has a retardation of not more than 50 nm, preferably from 0.1 to 10 nm, more preferably from 0.2 to 5 nm. The retardation is measurable using a RETS spectroscope (manufactured by Otsuka Electronics Co., Ltd.).

The substrate for printed wiring of the present invention preferably has a humidity expansion coefficient of not more than 15 ppm/K, more preferably from 5 to 12 ppm/K. The humidity expansion coefficient is measurable using MA (TMA-SS6100 manufactured by SII Nano Technology, Inc.) humidity control option. The substrate having a humidity expansion coefficient being within the above range, which shows high dimensional stability under high humidity, can be used more favorably for printed wiring.

The printed wiring laminate of the present invention is obtained by providing a wiring portion on the substrate for printed wiring. The printed wiring laminate of the present invention, by comprising the wiring portion and the substrate for printed wiring that comprises the polymer (I), achieves excellent adhesion between the substrate and the wiring portion.

The wiring portion, which is composed of a conductive material such as a copper layer, indium tin oxide (ITO), polythiophene, polyaniline and polypyrrole, is formed on the film, for example, by e.g., laminating method, metallizing method, sputtering method, deposition method, coating method, and printing method.

Under laminating method, for example, a metal foil such as a copper foil is heat pressed on the substrate for printed wiring of the present invention, whereby the substrate for printed wiring having the conductive layer can be produced. Then, by e.g., etching this conductive layer, the substrate for printed wiring having the wiring portion can be produced.

Under metallizing method, for example, a seed layer comprising a Ni-based metal can be formed, by deposition method or sputtering method, so as to bond with the substrate for printed wiring of the present invention. Then, on the seed layer, a conductive layer such as copper with a specific thickness is provided by wet plating method or the like, whereby the substrate for printed wiring having the conductive layer can be produced. Then, by e.g., etching this conductive layer, the substrate for printed wiring having the wiring portion can be produced. Under metallizing method, in order to improve the adhesion of the metal such as Ni, it is preferable that the substrate for printed wiring of the present invention is previously surface-modified by plasma treatment or the like.

Under sputtering method, for example, with an inert gas introduced into vacuum, direct current high voltage or the like is applied to between the substrate for printed wiring and a target (a substance to form a film) such as indium tin oxide (ITO), whereby the substrate for printed wiring having the conductive layer can be produced. Then, by e.g., etching this conductive layer, the substrate for printed wiring having the wiring portion can be produced.

Under deposition method, for example, a precursor of a substance to form a film is vaporized and precipitated on the substrate for printed wiring, whereby the substrate for printed wiring having the wiring portion can be produced.

Under coating method, for example, a solution containing an intended conductive material is applied on the substrate for printed wiring by roll coating, gravure coating, spin coating, or a method using a doctor blade. Under printing method, for example, a solution containing an intended conductive material is printed on the substrate for printed wiring using a screen printer, an ink jet printer, a dispenser, a flexo printer, a gravure printer or the like. Thereby, the substrate for printed wiring having the wiring portion can be produced.

When the printed wiring laminate of the present invention is subjected to MIT folding endurance test (ASTM D2176, temperature: 23° C., humidity: 50%, bending angle: ±135°, bending rate: 100 times/minute, load: 250 g, bending radius: 3 mm), the number of times of the bending operation until the peeling of the wiring portion is preferably 15,000 or more, more preferably 30,000 or more. The bending operation counted as one time is as follows: the substrate for printed wiring, initially being at a position of 0° (at a horizontal state), is bended to a position of +135°, and via the position of 0°, is bended to a position of −135°, before returned to the position of 0°.

When the printed wiring laminate of the present invention is subjected to cooling/heating test, the number of times of the cooling/heating test until the peeling of the wiring portion is preferably more than 15, more preferably 10 or more. The cooling/heating test operation counted as one time is as follows: the laminate is placed in a thermostatic chamber set at a prescribed temperature (240° C.), kept therein for 30 minutes, collected therefrom, returned to under room temperature, and kept there for 1 hour.

The substrate for printed wiring of the present invention comprises the heat resistant polymer excellent in transparency and moldability, and thus has high light transmission property and excellent heat resistance and resistance to thermal coloration. Thus, the substrate for printed wiring of the present invention can be favorably used for substrates for conductive flexible printed wiring and substrates for rigid printed wiring of mobile phones, touch panels, electronic paper and the like, substrates for photoelectronic printed wirings, substrates for COF (Chip on Film), substrates for TAB (Tape Automated Bonding), and the like.

The substrate for printed wiring (printed wiring laminate) usually has components mounted thereon, such as a performance component, a large scale integrated circuit (LSI) and/or a circuit component, before integrated into an electronic device. At this time, positions of the components on the substrate for printed wiring are determined, and then the components are mounted on the determined positions.

Mounting components on a conventional substrate for printed wiring with a wiring pattern having a wide wiring pitch did not require such a high precision in the positions where the components are mounted. However, with electronic devices having higher performance, smaller size and smaller weight and the like, mounting components on a substrate for printed wiring having a fine pitch, i.e., having a narrow wiring pitch, requires high precision in the positions where the components are mounted.

In order to mount the components on the substrate with high precision, at present, the positions where the components are mounted are grasped by means of e.g., transmitted light, before the components are mounted on the substrate. Thus, a high total light transmittance is demanded for the substrate with a wiring pattern having a pitch of not more than 30 μm for the printed wiring laminate.

The substrate for printed wiring of the present invention, when having a thickness of 50 μm, has a total light transmittance in accordance with JIS K7105 transparency test method being within the above range, and has excellent heat resistance, resistance to thermal coloration, mechanical strength, insulating property, dimensional stability, adhesion with a wiring portion, and the like, and therefore is used favorably particularly as a substrate for printed wiring with a wiring pattern having a pitch of not more than 30 μm.

EXAMPLES

Hereinafter, the present invention is specifically described with reference to Examples.
(1) Structure Analysis
The analysis of structures of polymers obtained in the following Examples was carried out by IR (ATR method, FT-IR, 6700, manufactured by NICOLET).
(2) Weight Average Molecular Weight
The weight average molecular weight of polymers obtained in the following Examples and Comparative Examples was measured using a HLC-8220 GPC apparatus manufactured by TOSOH. As a solvent, N-methyl-2-pyrrolidone (NMP) to which lithium bromide and phosphoric acid had been added was used. At a measurement temperature of 40° C., the molecular weight in terms of polystyrene was determined.
(3) Optical Properties
(3a) Total Light Transmittance
The total light transmittance of films obtained in the following Examples and Comparative Examples was measured in accordance with JIS K7105 transparency test method. Specifically, measurement was carried out using a SC-3H haze meter manufactured by Suga Test Instruments Co., Ltd.
(3b) Light Transmission Property
The transmittance at a wavelength of 400 nm of films obtained in the following Examples and Comparative Examples was measured using a V-570 UV/VIS/NIR spectroscope manufactured by JASCO Corporation.
(3c) Optical Anisotropy
The retardation of films obtained in the following Examples and Comparative Examples was measured using a RETS spectroscope manufactured by Otsuka Electronics Co., Ltd. The evaluation of the retardation is based on the film thickness standardized at 100 μm.
(4) Heat Resistance
(4a) Glass Transition Point
The glass transition point of polymers and films obtained in the following Examples and Comparative Examples was measured using a DSC 8230 measurement apparatus manufactured by Rigaku Corporation, at a heating rate of 20° C./minute.
(4b) Resistance to Thermal Coloration
The resistance to thermal coloration of films obtained in the following Examples and Comparative Examples was evaluated in terms of whether a film that had been heat treated in atmosphere at 230° C. for 2 hours had coloration or not.
(5) Mechanical Properties
The tensile strength, the elongation at break, the tensile modulus of films obtained in the following Examples and Comparative Examples were measured in accordance with JIS K7127 using a tensile tester 5543 (manufactured by INSTRON).
(6) Molding Processability
From polymers obtained in the following Examples and Comparative Examples, films were prepared by the following method. The resin composition was applied using a doctor blade on a support composed of polyethyleneterephthalate (PET) such that the film thickness after drying became 50±10 μm, and was dried at 80° C. for 30 minutes and then dried at 150° C. for 60 minutes, thereby forming a film. Thereafter, the film was peeled from the PET support. Then, the film was fixed to a metal frame, and was dried, as a final drying, for 2 hours, at a temperature ranging from 150° C. to 300° C. according to the type of the polymers. Molding processability was evaluated based on film appearance and residual solvent amount ((thermogravimetric analysis method: TGA), under nitrogen atmosphere, heating rate: 10° C./minute).

The film appearance was evaluated under the following criteria: when visual observation of the film found none of blem, warpage and waviness, the film was evaluated as "AA"; and when visual observation of the film found blem, warpage or waviness, the film was evaluated as "CC".
(7) Adhesion with Conductive Layers
A film (5 cm×10 cm) obtained in the following Examples and Comparative Examples was fixed to a metal frame and set in a sputtering apparatus. Then, a surface of the film was plasma-treated. The plasma treatment was carried out in an argon gas at a frequency of 13.56 MHz, an output of 200 W, a gas pressure of $1\times10^{-3}$ Torr, a treatment temperature of 2° C., a treatment time of 2 minutes. Then, at a frequency of 13.56 MHz, an output of 450 W, a gas pressure of $3\times10^{-3}$ Torr, using a nickel-chromium alloy (chromium: 10% by mass) as a target, under an argon atmosphere, a nickel-chromium alloy coating film (seed layer) with a thickness of about 10 nm was formed by DC magnetron sputtering method at a rate of 1 nm/second. Then, by depositing copper, a copper thin film with a thickness of 0.3 µm was formed thereon. Furthermore, by subjecting a surface of the copper thin film to copper sulfate plating bath, a copper layer with a thickness of 10 µm was further formed thereon. Subsequently, the layers were subjected to heat treatment/drying at 150° C. for 10 minutes. Thereby, a substrate for printed wiring one side of which had the conductive layers was prepared.

Then, the adhesion between the film of the substrate for printed wiring and the conductive layers was evaluated under the following criteria.

(Folding Endurance Test)

The resultant substrate for printed wiring one side of which had the conductive layers was subjected to bending test under the environment of a temperature of 23° C. and a humidity of 50%. Test conditions were in accordance with MIT folding endurance test (ASTM D2176).

The conditions were as follows: bending angle: ±135°, bending rate: 100 times/minute, load: 250 g, and bending radius: 3 mm. The bending operation counted as one time was as follows: the substrate for printed wiring, initially being at a position of 0° (at a horizontal state), was bended to a position of +135°, and via the position of 0°, was bended to a position of ±135°, before returned to the position of 0°.

The number of times until the peeling between the film of the substrate for printed wiring one side of which had the conductive layers and the conductive layers was measured. The occurrence of neither breaking nor cracking even after more than 30,000 times of the bending operation was evaluated as "AA"; the occurrence of breaking or cracking with the number of times of the bending operation being from 15,000 to 30,000 was evaluated as "BB"; and the occurrence of breaking or cracking with the number of times of the bending operation being not more than 30,000 was evaluated as "CC".

(Cooling/Heating Test)

The resultant substrate for printed wiring one side of which had the conductive layers was subjected to cooling/heating test. The cooling/heating test operation counted as one time was as follows: the substrate was placed in a thermostatic chamber set at a prescribed temperature (240° C.), kept therein for 30 minutes, collected therefrom, returned to under room temperature, and kept there for 1 hour. The number of times of the cooling/heating test until the peeling between the film of the substrate for printed wiring one side of which had the conductive layers and the conductive layers was measured.

The occurrence of none of peeling, breaking and cracking even after more than 15 times of the cooling/heating test was evaluated as "AA"; the occurrence of peeling, breaking or cracking with the number of times of the cooling/heating test being from 10 to 15 was evaluated as "BB"; and the occurrence of breaking or cracking with the number of times of the cooling/heating test being less than 10 was evaluated as "CC".

(8) Environmental Stability (Humidity Expansion Coefficient)

The humidity expansion coefficient of films obtained in the following Examples and Comparative Examples was measured using MA (TMA-SS 6100 manufactured by SII Nano Technology) humidity control option, under the following conditions.

Humidity conditions: 40% RH→70% RH (tensile method: a load of 5 g)

Temperature: 23° C.

Example 1

Preparation of Aromatic Polyether Resin

Into 1000 mL four-neck flask equipped with a thermometer, a stirrer, a nitrogen introducing tube, a Dean-Stark tube and a cooling tube, the component (B): 9,9-bis(4-hydroxyphenyl)fluorene (70.08 g, 200 mmol), the component (A): 2,6-difluorobenzonitrile (27.82 g, 200 mmol), potassium carbonate (33.17 g, 240 mmol), N-methyl-2-pyrrolidone (NMP) (550 mL) and toluene (270 mL) were added. After the flask was purged with nitrogen, the resultant solution was reacted at 130° C. Water generated was removed through the Dean-Stark tube, and when the generation of water was not recognized, temperature was gradually increased to 160° C., and at this temperature, the reaction was performed for 5 hours.

After the solution was cooled to room temperature, the solution was poured into an excessive of methanol, and a cake (residue) was isolated by filtration. The resultant cake was vacuum dried at 60° C. overnight, thereby obtaining a white powder (polymer) (83.61 g, yield: 93%).

With regard to the resultant polymer, the analysis of a structure, and the measurement of a glass transition point and a weight average molecular weight were carried out. Results were as follows: the characteristic absorption of infrared spectrum was at 2229, 1575, 1500cm$^{-1}$; the glass transition point was 285° C.; and the weight average molecular weight was 107,000.

Subsequently, the resultant polymer was redissolved in N,N-dimethylacetoamide (DMAc) to obtain a resin composition having the polymer concentration of 15% by mass. The resin composition was applied using a doctor blade on a support composed of polyethyleneterephthalate (PET), and was dried at 80° C. for 30 minutes and then dried at 150° C. for 60 minutes, thereby forming a film. Then, the film was peeled from the PET support. Thereafter, the film was fixed to a metal frame, and dried at 200° C. for 2 hours, thereby obtaining a film for evaluation with a thickness 50 µm.

The resultant polymer had excellent solubility in the organic solvent (DMAc).

With regard to the resultant film, results of optical properties, heat resistance, mechanical properties, molding processability, adhesion and environmental stability are shown in Table 1 and Table 2.

Example 2

The same operation was performed as in Example 1, except that 9,9-bis(4-hydroxyphenyl)fluorene (70.08 g, 200 mmol) was replaced with 9,9-bis(4-hydroxyphenyl)fluorene (63.07 g, 180 mmol) and 4,4'-biphenol (3.72 g, 20 mmol), thereby obtaining a white powder (polymer) (79.69 g, yield: 92%). Further, using the polymer, a film for evaluation with a thickness 50 µm was obtained in the same manner as in Example 1.

With regard to the resultant polymer, the characteristic absorption of infrared spectrum was at 2229, 1573, 1445 cm$^{-1}$; the glass transition point was 270° C.; and the weight average molecular weight was 127,000.

The resultant polymer had excellent solubility in the organic solvent (DMAc).

The resultant film was evaluated in the same manner as in Example 1. Results are shown in Table 1 and Table 2.

Example 3

The same operation was performed as in Example 1, except that 9,9-bis(4-hydroxyphenyl)fluorene (70.08 g, 200 mmol) was replaced with 9,9-bis(4-hydroxyphenyl)fluorene (42.05 g, 120 mmol) and 4,4'-biphenol (14.90 g, 80 mmol), thereby obtaining a white powder (polymer) (72.16 g, yield: 94%). Further, using the polymer, a film for evaluation with a thickness 50 µm was obtained in the same manner as in Example 1.

With regard to the resultant polymer, the characteristic absorption of infrared spectrum was at 2229, 1573, 1455 cm$^{-1}$; the glass transition point was 245° C.; and the weight average molecular weight was 131,000.

The resultant polymer had excellent solubility in the organic solvent (DMAc).

The resultant film was evaluated in the same manner as in Example 1. Results are shown in Table 1 and Table 2.

Example 4

Into a 3 L four-neck flask, the component (A): 2,6-difluorobenzonitrile (hereinafter also referred to as "DFBN") (35.12 g (0.253 mol)), the component (B): 9,9-bis(4-hydroxyphenyl)fluorene (hereinafter also referred to as "BPFL") (70.08 g (0.200 mol)), resorcinol (hereinafter also referred to as "RES") (5.51 g (0.050 mol)), potassium carbonate (41.46 g (0.300 mol)), N,N-dimethylacetoamide (hereinafter also referred to as "DMAc") (443 g) and toluene (111 g) were added. Then, to the four-neck flask, a thermometer, a stirrer, a three-way cock with a nitrogen introducing tube, a Dean-Stark tube and a cooling tube were attached.

Then, after the flask was purged with nitrogen, the resultant solution was reacted at 140° C. for 3 hours. Water generated was removed as needed through the Dean-Stark tube. When the generation of water was not recognized, temperature was gradually increased to 160° C., and at this temperature, the reaction was performed for 6 hours.

After the solution was cooled to room temperature (25° C.), a salt generated was removed using a filter paper. The filtrate was poured into methanol and reprecipitated. The solution was subjected to filtration to isolate cake (residue). The resultant cake was vacuum dried at 60° C. overnight, thereby obtaining a white powder (polymer) (amount yielded: 95.67 g, yield: 95%).

With regard to the resultant polymer, the analysis of a structure and the measurement of a weight average molecular weight were carried out. Results were as follows: the characteristic absorption of infrared spectrum was at 3035 (C—H-stretch), 2229 cm$^{-1}$ (CN), 1574 cm$^{-1}$, 1499 cm$^{-1}$ (aromatic ring skeleton absorption), 1240 cm$^{-1}$ (—O—); and the weight average molecular weight was 130,000.

Subsequently, the resultant polymer was redissolved in DMAc to obtain a resin composition having the polymer concentration of 25% by mass. The resin composition was applied using a doctor blade on a support composed of a polyethyleneterephthalate (PET), and was dried at 70° C. for 30 minutes and then dried at 100° C. for 30 minutes, thereby forming a film. Then, the film was peeled from the PET support. Thereafter, the film was fixed to a metal frame, and dried at 230° C. for 2 hours, thereby obtaining a film for evaluation with a thickness 50 μm.

The resultant film was evaluated in the same manner as in Example 1. Results are shown in Table 1 and Table 2.

The resultant polymer had excellent solubility in the organic solvent (DMAc).

Example 5

The same operation was performed as in Example 4, except that resorcinol was replaced with 2,2-bis(4-hydroxyphenyl)propane (11.41 g (0.050 mol)), thereby obtaining a film for evaluation. With regard to the resultant polymer, the weight average molecular weight was 98,000.

The resultant film was evaluated in the same manner as in Example 1. Results are shown in Table 1 and Table 2.

The resultant polymer had excellent solubility in the organic solvent (DMAc).

Example 6

The same operation was performed as in Example 4, except that as the component (B), BPFL (70.08 g) and RES (5.51 g) were replaced with 9,9-bis(4-hydroxyphenyl)fluorene (78.84 g (0.225 mol)), and 2,2-bis(4-hydroxyphenyl)-1,1,1,3,3,3-hexafluoropropane (8.41 g (0.025 mol)), thereby obtaining a film for evaluation. With regard to the resultant polymer, the weight average molecular weight was 105,000.

The resultant film was evaluated in the same manner as in Example 1. Results are shown in Table 1 and Table 2.

The resultant polymer had excellent solubility in the organic solvent (DMAc).

Example 7

The same operation was performed as in Example 4, except that as the component (B), BPFL (70.08 g) and RES (5.51 g) were replaced with 9,9-bis(3-phenyl-4-hydroxyphenyl)fluorene (125.65 g (0.250 mol)), thereby obtaining a film for evaluation. With regard to the resultant polymer, the weight average molecular weight was 146,000.

The resultant film was evaluated in the same manner as in Example 1. Results are shown in Table 1 and Table 2.

The resultant polymer had excellent solubility in the organic solvent (DMAc).

Example 8

The same operation was performed as in Example 4, except that as the component (B), BPFL (70.08 g) and RES (5.51 g) were replaced with 9,9-bis(4-hydroxyphenyl)fluorene (78.84 g (0.225 mol)) and 1,1-bis(4-hydroxyphenyl)cyclohexane (6.71 g (0.025 mol)), thereby obtaining a film for evaluation. With regard to the resultant polymer, the weight average molecular weight was 78,000.

The resultant film was evaluated in the same manner as in Example 1. Results are shown in Table 1 and Table 2.

The resultant polymer had excellent solubility in the organic solvent (DMAc).

Example 9

The same operation was performed as in Example 7, except that as component (A), DFBN (35.12 g) was replaced with 2,6-difluorobenzonitrile (28.10 g (0.202 mol)) and 4,4-difluorobenzophenone (11.02 g (0.051 mol)), thereby obtaining a film for evaluation. With regard to the resultant polymer, the weight average molecular weight was 122,000.

The resultant film was evaluated in the same manner as in Example 1. Results are shown in Table 1 and Table 2.

The resultant polymer had excellent solubility in the organic solvent (DMAc).

Example 10

The same operation was performed as in Example 9, except that the blending amount of the component (A) was changed as follows: 2,6-difluorobenzonitrile (17.56 g (0.126 mol)) and 4,4-difluorobenzophenone (27.55 g (0.126 mol)), thereby obtaining a film for evaluation. With regard to the resultant polymer, the weight average molecular weight was 157,000.

The resultant film was evaluated in the same manner as in Example 1. Results are shown in Table 1 and Table 2.

The resultant polymer had excellent solubility in the organic solvent (DMAc).

Example 11

The same operation was performed as in Example 7, except that as the component (A), 4,4-difluorodiphenylsulfone (DFDS) (78.84 g (0.250 mol)) was used, thereby obtaining a film for evaluation. With regard to the resultant polymer, the weight average molecular weight was 132,000.

The resultant film was evaluated in the same manner as in Example 1. Results are shown in Table 1 and Table 2.

The resultant polymer had excellent solubility in the organic solvent (DMAc).

Comparative Example 1

The same operation was performed as in Example 1, except that 9,9-bis(4-hydroxyphenyl)fluorene (70.08 g, 200 mmol)

was replaced with 2,2-bis(4-hydroxyphenyl)-1,1,1,3,3,3-hexafluoropropane (67.25 g, 200 mmol), thereby obtaining a white powder (polymer) (81.85 g, yield: 94%). Further, using the polymer, a film for evaluation with a thickness of 50 μm was obtained in the same manner as in Example 1.

With regard to the resultant polymer, the glass transition point was 190° C., and the weight average molecular weight was 159,000. The resultant film was evaluated in the same manner as in Example 1. Results are shown in Table 1 and Table 2. With regard to the cooling/heating test, measurement was impossible, because the resultant substrate for printed wiring one side of which had the conductive layers had deformation.

Comparative Example 2

As a film for evaluation, a Teonex (a polyethylenenaphthalate film manufactured by Teijin Ltd.) was used, and was evaluated in the same manner as in Example 1 (film thickness: 125 μm). Results are shown in Table 1 and Table 2. With regard to the cooling/heating test, measurement was impossible, because the resultant substrate for printed wiring one side of which had the conductive layers had deformation.

Comparative Example 3

Into 300 mL four-neck flask equipped with a thermometer, a stirrer, a nitrogen introducing tube and a cooling tube, 2,2-bis[4-(4-aminophenoxy)phenyl]propane (9.70 g (23.6 mmol)) was added. Then, after the flask was purged with nitrogen, NMP (60 mL) was added, and the mixture was stirred until becoming homogenous. Into the resultant solution, 2,3,5-tricarboxycyclopentyl acetic acid dianhydride (5.30 g (23.6 mmol)) was added at room temperature, and at this temperature, stirring was carried out for 12 hours and thereby the solution was reacted. As a result, a solution containing polyamic acid was obtained.

The resultant solution containing polyamic acid was diluted with NMP (75 mL). Into the resultant solution, pyridine (7.5 mL) and acetic anhydride (6.7 mL) were added. The mixture was stirred at 110° C. for 6 hours, thereby carrying out imidization. After the solution was cooled to room temperature, the solution was poured into an excessive of methanol, and a cake (residue) was isolated by filtration. The resultant cake was vacuum dried at 60° C. overnight, thereby obtaining a white powder (polymer) (amount yielded: 13.5 g, yield: 95.3%).

Subsequently, the resultant polymer was redissolved in DMAc to obtain a resin composition having the polymer concentration of 20% by mass. The resin composition was applied using a doctor blade (100 μm gap) on a support composed of polyethyleneterephthalate (PET), and was dried at 100° C. for 30 minutes and then dried at 150° C. for 60 minutes, thereby forming a film. Then, the film was peeled from the PET support. Thereafter, the film was dried under reduced pressure at 150° C. for 3 hours, thereby obtaining a film for evaluation with a thickness 50 μm. The evaluation was carried out in the same manner as in Example 1. Results are shown in Table 1 and Table 2.

TABLE 1

| | Optical properties | | | Heat resistance | |
|---|---|---|---|---|---|
| | Transmittance/ 400 nm [%] | Total light transmittance [%] | Retardation [nm] | Glass transition point [° C.] | Resistance to thermal coloration |
| Ex. 1 | 82 | 88 | 4.1 | 285 | No coloration |
| Ex. 2 | 84 | 88 | 4.7 | 270 | No coloration |
| Ex. 3 | 86 | 88 | 4.5 | 245 | No coloration |
| Ex. 4 | 85 | 88 | — | 270 | No coloration |
| Ex. 5 | 88 | 88 | — | 250 | No coloration |
| Ex. 6 | 85 | 88 | — | 252 | No coloration |
| Ex. 7 | 86 | 88 | — | 275 | No coloration |
| Ex. 8 | 85 | 88 | — | 260 | No coloration |
| Ex. 9 | 86 | 88 | — | 271 | No coloration |
| Ex. 10 | 86 | 88 | — | 250 | No coloration |
| Ex. 11 | 86 | 88 | — | 265 | No coloration |
| Com. Ex. 1 | 88 | 91 | 6.3 | 190 | No coloration |
| Com. Ex. 2 | 77 | 88 | Immeasurable Large anisotropy | 118 | No coloration |
| Com. Ex. 3 | 85 | 88 | 12 | 282 | Coloration |

TABLE 2

| | Mechanical properties | | | Molding processability | | Adhesion | | Environmental stability Humidity |
|---|---|---|---|---|---|---|---|---|
| | Tensile strength [MPa] | Elongation at break [%] | Tensile modulus [GPa] | Film appearance | Residual solvent amount [%] | Folding endurance test | Cooling/heating test | expansion coefficient [ppm/K] |
| Ex. 1 | 124 | 15 | 2.9 | AA | 0.4 | BB | AA | 7 |
| Ex. 2 | 122 | 38 | 2.9 | AA | 0.2 | AA | BB | 9 |
| Ex. 3 | 130 | 43 | 2.9 | AA | 0.2 | AA | BB | 9 |
| Ex. 4 | 113 | 28 | 2.9 | AA | 0.3 | AA | AA | 10 |
| Ex. 5 | 128 | 44 | 3.0 | AA | 0.2 | AA | BB | 8 |
| Ex. 6 | 121 | 23 | 3.1 | AA | 0.2 | AA | BB | 8 |

TABLE 2-continued

|  | Mechanical properties | | | Molding processability | | Adhesion | | Environmental stability Humidity |
| --- | --- | --- | --- | --- | --- | --- | --- | --- |
|  | Tensile strength [MPa] | Elongation at break [%] | Tensile modulus [GPa] | Film appearance | Residual solvent amount [%] | Folding endurance test | Cooling/heating test | expansion coefficient [ppm/K] |
| Ex. 7 | 129 | 9 | 3.2 | AA | 0.3 | AA | AA | 6 |
| Ex. 8 | 110 | 26 | 3.1 | AA | 0.3 | AA | AA | 6 |
| Ex. 9 | 120 | 54 | 3.1 | AA | 0.2 | AA | AA | 7 |
| Ex. 10 | 117 | 52 | 3.2 | AA | 0.2 | AA | BB | 7 |
| Ex. 11 | 124 | 22 | 3.0 | AA | 0.3 | AA | AA | 6 |
| Com. Ex. 1 | 86 | 30 | 2.7 | AA | 0.2 | CC | — | 8 |
| Com. Ex. 2 | Not broken | Not broken | 4.8 | — | — | BB | — | 10 |
| Com. Ex. 3 | 108 | 66 | 2.7 | AA | 1.5 | CC | CC | 99 |

It is clear from Table 2 that the film comprising the aromatic polyether-typed polymer having a glass transition temperature of from 230° C. to 350° C. has excellent molding processability. Furthermore, it is clear that the film comprising the aromatic polyether-typed polymer having a glass transition temperature of from 230° C. to 350° C. has high light transmittance and is excellent with good balance in dimensional change due to water absorption (environmental stability), heat resistance, mechanical strength and adhesion with the conductive layers (Examples 1 to 11). On the other hand, the film of Comparative Example 1 has insufficient heat resistance and adhesion with the conductive layers, and the film of Comparative Example 2 has insufficient heat resistance, inferior light transmission property, and has large anisotropy. The film of Comparative Example 3 has inferior resistance to thermal coloration, adhesion with the conductive layers and water absorption resistance.

The invention claimed is:

1. A printed wiring laminate comprising a transparent printed wiring substrate and a wiring portion provided on the transparent printed wiring substrate, wherein the transparent printed wiring substrate comprises an aromatic polyether-typed polymer having a glass transition temperature, as measured by differential scanning calorimetry (DSC, heating rate: 20° C./minute), of from 230° C. to 350° C., wherein the transparent printed wiring substrate, when having a thickness of 50 μm, has a total light transmittance in accordance with JIS K7105 transparency test method of 85% or more.

2. The transparent printed wiring laminate according to claim 1, wherein the aromatic polyether-typed polymer is a polymer comprising at least one structural unit (i) selected from the group consisting of a structural unit represented by formula (1) and a structural unit represented by formula (2):

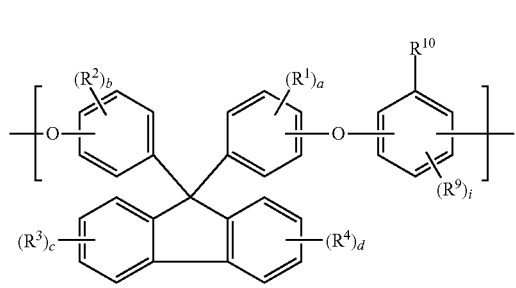

(1)

wherein in the formula (1), $R^1$ to $R^4$ are each independently a monovalent organic group having 1 to 12 carbon atoms; $R^9$ are each independently a monovalent organic group having 1 to 12 carbon atoms; $R^{10}$ is cyano group or nitro group; a to d are each an integer of from 0 to 4; and i is an integer of from 0 to 3,

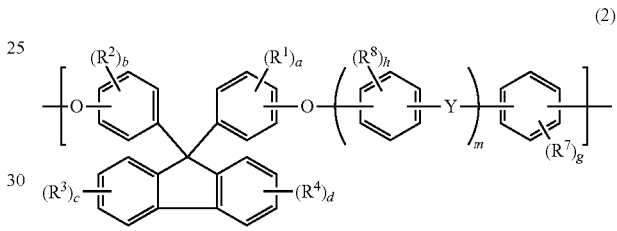

(2)

wherein in the formula (2), $R^1$ to $R^4$ and a to d are each independently defined in the same manner as $R^1$ to $R^4$ and a to d in the formula (1); Y is a single bond, —$SO_2$—, or >C=O; $R^7$ and $R^8$ are each independently a halogen atom, a monovalent organic group having 1 to 12 carbon atoms, or nitro group; g and h are each independently an integer of from 0 to 4; and m is 0.

3. The transparent printed wiring laminate according to claim 2, wherein the polymer further comprises at least one structural unit (ii) selected from the group consisting of a structural unit represented by formula (3) and a structural unit represented by formula (4):

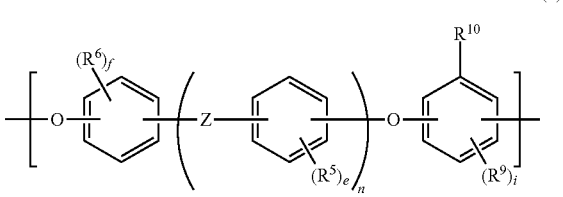

(3)

wherein in the formula (3), $R^9$, $R^{10}$ and i are each independently defined in the same manner as $R^9$, $R^{10}$ and i in the formula (1); $R^5$ and $R^6$ are each independently a monovalent organic group having 1 to 12 carbon atoms; Z is a single bond, —O—, —S—, —$SO_2$—, >C=O, —CONH—, —COO—, or a divalent organic group having 1 to 12 carbon atoms, e and f are each an integer of from 0 to 4; and n is 0 or 1,

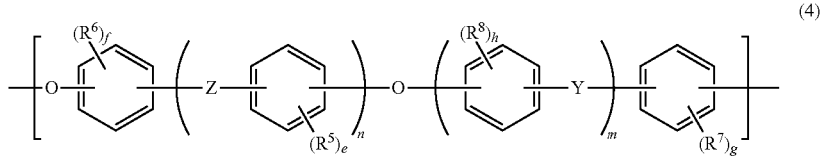

wherein in the formula (4), $R^7$, $R^8$, Y, m, g and h are each independently defined in the same manner as $R^7$, $R^8$, Y, m, g and h in the formula (2); $R^5$, $R^6$, Z, n, e and f are each independently defined in the same manner as $R^5$, $R^6$, Z, n, e and f in the formula (3).

4. The transparent printed wiring laminate according to claim 3, wherein in the polymer, the molar ratio between the structural unit (i) and the structural unit (ii) is in the range of from 30:70 to 90:10.

5. The transparent printed wiring laminate according to claim 3, wherein the polymer comprises the structural unit (i) and the structural unit (ii), in an amount of 70 mol % or more, in all structural units of the polymer.

6. The transparent printed wiring laminate according to claim 1, wherein the transparent printed wiring substrate has a tensile strength in accordance with JIS K7127 of from 80 to 150 MPa.

7. The transparent printed wiring laminate according claim 1, wherein the transparent printed wiring substrate has an elongation at break in accordance with JIS K7127 of from 10 to 100%.

8. The transparent printed wiring laminate according to claim 1, wherein the transparent printed wiring substrate has a tensile modulus in accordance with JIS K7127 of from 2.5 to 4.0 GPa.

9. The transparent printed wiring laminate according to claim 1, wherein the substrate further comprises an anti-aging agent.

10. The transparent printed wiring laminate according to claim 9, wherein the anti-aging agent includes a hindered phenol compound having a molecular weight of 500 or more.

11. The transparent printed wiring laminate according to claim 10, wherein an amount of hindered phenol compound is 0.01 to 10 parts by weight based on 100 parts by weight of the aromatic polyether-typed polymer.

12. The transparent printed wiring laminate according to claim 1, wherein a thickness of the transparent printed wiring substrate is 1 to 250 μm.

13. The transparent printed wiring laminate according to claim 1, wherein the transparent printed wiring substrate, when having a thickness of 50 μm, has a light transmittance at a wavelength of 400 nm in accordance with JIS K7105 transparency test method of 70% or more.

* * * * *